United States Patent [19]
Nier

[11] 3,715,633
[45] Feb. 6, 1973

[54] SEMICONDUCTOR UNIT WITH INTEGRATED CIRCUIT

[76] Inventor: Johannes Nier, Pirmasenser Str. 32, Stuttgart, Germany

[22] Filed: July 15, 1971

[21] Appl. No.: 162,996

Related U.S. Application Data

[62] Division of Ser. No. 16,303, March 4, 1970, abandoned.

[52] U.S. Cl. .......317/234 R, 317/234 A, 317/234 G, 317/234 M, 317/234 N, 29/589, 29/591

[51] Int. Cl. ..............................H01l 3/00, H01l 5/00

[58] Field of Search ..317/234, 235 A, 235 G, 235 H, 317/235 L, 235 M, 235 N; 29/588, 589, 591

[56] References Cited

UNITED STATES PATENTS

| | | | |
|---|---|---|---|
| 3,400,311 | 9/1968 | Dahlberg et al. | 317/234 |
| 3,539,803 | 11/1970 | Beerman | 317/234 |
| 3,584,265 | 6/1971 | Nier | 317/234 |

*Primary Examiner*—John W. Huckert
*Assistant Examiner*—Andrew J. James
*Attorney*—Michael S. Striker

[57] ABSTRACT

A semiconductor element. A first semiconductor body has a pair of first major surfaces on opposite sides. A first contact is provided on and covers one of the first surfaces. A socket plate is conductively connected to the other of the first surfaces and has a first contact pin. A second semiconductor body has a pair of second major surfaces and a second contact provided on and covering one of these second major surfaces. A carrier is connected with the socket plate and the second semiconductor body and located between the two. A second contact pin is provided on the second body at a side thereof facing away from the carrier and a third contact pin is provided, both the second and third contact pins penetrating the socket in insulated relationship. A connecting wire has a straight first end portion conductively secured to the second contact pin, a helically convoluted second portion conductively secured to the third contact pin, and a center portion with respect to which each of the end portions extends at an angle. An additional contact pin is provided on the first semiconductor body at a side thereof facing away from the socket plate and is in direct electrically conductive engagement with the carrier.

7 Claims, 16 Drawing Figures

INVENTOR
Johannes NIER
BY
[signature]
his ATTORNEY

INVENTOR
Johannes NIER
BY his ATTORNEY

INVENTOR
Johannes NIER
BY
[signature]
his ATTORNEY

INVENTOR
Johannes NIER
BY
[signature]
his ATTORNEY

SEMICONDUCTOR UNIT WITH INTEGRATED CIRCUIT

CROSS-REFERENCE TO RELATED APPLICATIONS

Related applications were filed in 1970 in the name of Johannes Nier; they are copending under Ser. No. 3,388 filed on Jan. 16, 1970 and now U.S. Pat. No. 3,611,555 under the title "Method of Assembling a Semiconductor Device", and Ser. No. 16,303, filed Mar. 4, 1970 and now abandoned, of which latter this is a division.

BACKGROUND OF THE INVENTION

The present invention relates generally to semiconductors, and more particularly to semiconductor units. Still more specifically the present invention relates to a novel semiconductor unit.

In one of the aforementioned related applications semiconductor elements or units have been disclosed having a semiconductor body an entire major surface of which is covered with a first contact. The other major surface is connected by soldering to a socket plate which carries a first contact pin, and a second semiconductor body is again provided with a contact covering an entire major surface thereof and being conductively connected by soldering to a carrier which is arranged upwardly above the socket plate. The carrier is provided with an opening into which extends a second contact pin which passes through the socket plate in insulated relationship. The semiconductor body which is connected by soldering to the carrier is provided on its surface facing away from the carrier with an additional contact which is connected by means of a wire with a further or third contact pin passing in insulated relationship through the socket plate. The wire has a first end portion which is straight and extends at an angle to a center portion of the wire and which is soldered to the contact of the semiconductor body which is conductively connected with the carrier; a further end portion of the wire, also angled with respect to the center portion thereof, is helically convoluted and slipped over the third contact pin and soldered thereto. Finally, the semiconductor body which is soldered to the socket plate is provided on its surface facing away from the socket plate with an additional contact which is electrically conductively connected with the carrier.

This semiconductor element, proposed in the aforementioned related copending applications, has certain advantages over the prior art which are developed in detail in the copending applications. It is pointed out that in that construction the electrically conductive connection between the carrier and thus the semiconductor body soldered onto the socket plate, or more specifically the second contact of this semiconductor body, is provided by the second contact pin which extends into the opening provided in the carrier, and by means of a further contact wire which extends from this second contact pin to the second contact of the semiconductor body which is soldered to the socket plate. This additional or second contact wire is constructed in the same manner as the above-described first-mentioned contact wire and is secured to its associated components in the same manner as the first-mentioned contact wire is connected with the components associated therewith. It has been found, however, that in the interest of still simpler manufacture of a semiconductor element, and concomitant savings in time, labor costs and material costs, further improvements are desirable.

SUMMARY OF THE INVENTION

It is, accordingly, an object of the present invention to provide such further improvements.

More particularly it is an object of the present invention to provide an improved semiconductor unit of the aforedescribed type which is less expensive to construct and therefore less expensive to sell.

In addition it is another object of the invention to provide such a semiconductor unit in which the last-mentioned contact wire, which in the semiconductor element described in the aforementioned copending application connects the second contact on the semiconductor body mounted on the socket plate with the second contact pin, can be eliminated, thereby effecting a saving in material.

In pursuance of the above objects, and others which will become apparent hereafter, one feature of the invention resides in a semiconductor unit which, briefly stated, comprises a first semiconductor body having a pair of first major surfaces on opposite sides. A first contact is provided on and covers one of these first surfaces. A socket plate is conductively connected to the other of the first surfaces and has a first contact pin. A second semiconductor body has a pair of second major surfaces. A second contact is provided on and covers one of these second surfaces. A carrier is connected with the socket plate and second semiconductor body and located between the two. A second contact pin is provided on the second body at a side thereof facing away from the carrier, and a third contact pin is provided, both of them penetrating the socket plate in insulated relationship. A connecting wire has a straight first end portion conductively secured to the second contact pin, helically convoluted second end portion conductively secured to a third contact pin, and a center portion with respect to which each of the end portions extends at an angle. An additional contact pin is provided on the first semiconductor body at a side thereof facing away from the socket plate and this additional contact pin is in direct electrically conductive engagement with the carrier.

Thus, it is the carrier itself which provides the electrically conductive connection between the second contact of the semiconductor body mounted on the socket plate and the carrier. The separate connecting wire is thereby eliminated, as is the time previously required for securing it.

Advantageously the carrier has a section which is downwardly bent (towards the socket plate) and which tapers in the same direction, with the lower free end contacting and being soldered with the second contact of the second semiconductor body which is in turn soldered to the socket plate. In order to make it possible on assembly of the semiconductor unit to position the plane of the carrier in parallelism with the upper surface of the socket plate, the whole of the carrier is surrounded by a cylindrical bead coaxial with the hole and providing a guide and a means for soldering along the contact pin extending into the hole. In the interest of ready assembly and a certain amount of movability during soldering the inner diameter of the bead must be somewhat larger than the outer diameter of the contact pin to be received therein, and this to some extent negates the desired guidance effect and the parallel positioning desired to be obtained between the carrier plane and the surface of the socket plate. The reason for this is that the differential in inner and outer diameter of bead and associated contact pin makes possible skewing of their respective axes. To overcome this problem the portion of the carrier which carries the second semiconductor body is bent with reference to the general cross-sectional plane of the bead.

In a semiconductor unit in which both semiconductor bodies are provided each with an additional contact, with each of the additional contacts being electrically conductively connected with a fourth contact pin passing in insulated relationship through the socket plate, it is advantageous to establish this electrically conductive connection in form of a contact wire which extends from the additional contacts of the respective semiconductor bodies to the fourth contact pin. Advantageously this contact wire is provided with two vertically oriented end portions whose lower free ends are soldered to the respective third contacts of the semiconductor bodies, to at least substantially horizontally extending intermediate portions and located between and of one piece with these intermediate portions a helically convoluted portion which is slipped over and soldered to the fourth contact pin. Of course, this helically convoluted portion can also be secured in desired manner with the substantially horizontally extending portions, if desired, but construction of one piece is of course simpler. This contact wire can of course be replaced with two individual wires which are each connected with the fourth contact pin and with one of the third contacts of the respective semiconductor bodies.

The invention is further concerned with permitting the proper orientation of the individual elements of the unit during assembly so as to make possible the solder connections between them in a single passage through a soldering oven, and to maintain this orientation during passage of the unit through the soldering oven.

According to the present invention this is achieved in that a holding device is provided composed of three templates which are formed with cut-outs for the individual components of at least one semiconductor unit according to the present invention. The templates can be stacked one above the other and guided in parallelism with one another by provision of suitable guide means. At least one of the socket plates to be used in assembling a semiconductor unit according to the present invention is provided with at least three contact pins formed on its underside which extend into bores provided for this purpose in a first one of the templates, whereupon the second template is put in place, which is provided with a cut-out into which the semiconductor body which is to be soldered to the socket plate is placed. Solder is provided on at least one major surface of the semiconductor body and a solder layer can also be positioned between the semiconductor body and the socket plate. The carrier is then inserted into another cut-out also provided in the second template and solder is provided in suitable manner, for instance in form of a solder layer or sheet. Then the third template is put in place and into a cut-out provided therein the second semiconductor body to be soldered to the carrier is placed, at least one major surface of this second semiconductor body is covered with solder. At least one contact wire is inserted into an additional cut-out provided in the third template and its helically convoluted end portion is simultaneously slipped over the associated contact pin and downwardly along the same until it extends skew with reference to the contact pin and thus clampingly engages the same. A ring of solder material is then placed around each of the contact pins which pass through the socket plate in insulated relationship, and thereupon the second and third templates are again removed and finally only the first template with the semiconductor unit assembled on it is passed into and through the soldering oven.

The clamping engagement of the helically convoluted portion of the contact wire or wires serves to press the semiconductor bodies or crystals onto their respective supports, so that even before the soldering all components of the entire semiconductor unit are fixed at their respective locations and cannot be dislodged by vibrations or the like.

The novel features which are considered as characteristic for the invention are set forth in particular in the appended claims. The invention itself, however, both as to its construction and its method operation, together with additional objects and advantages thereof, will be best understood from the following description of specific embodiments when read in connection with the accompanying drawing.

Figure 1:
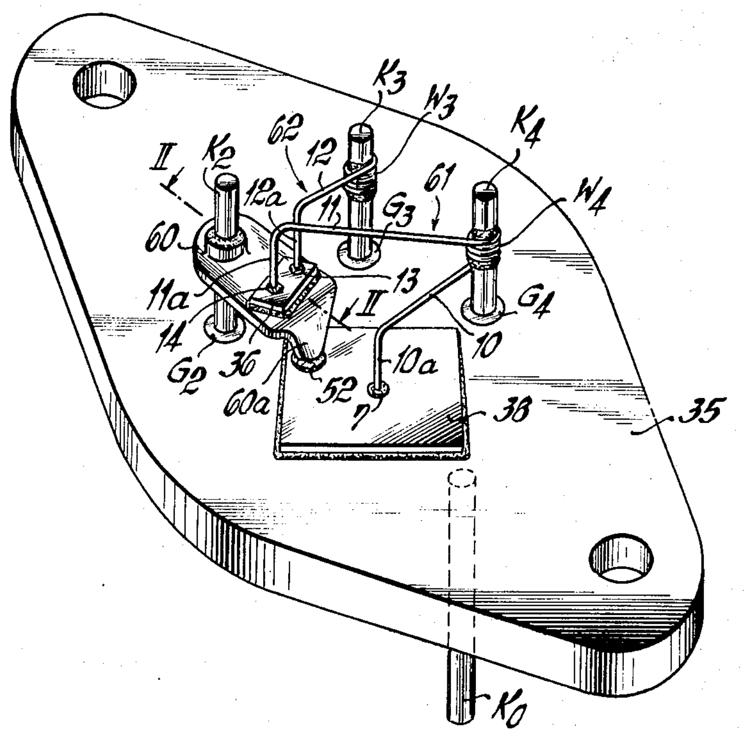
FIG. 1 is a perspective view illustrating a novel semiconductor unit with the cover removed for clarity.
Figures 3A, 3B, 3C, 3D:
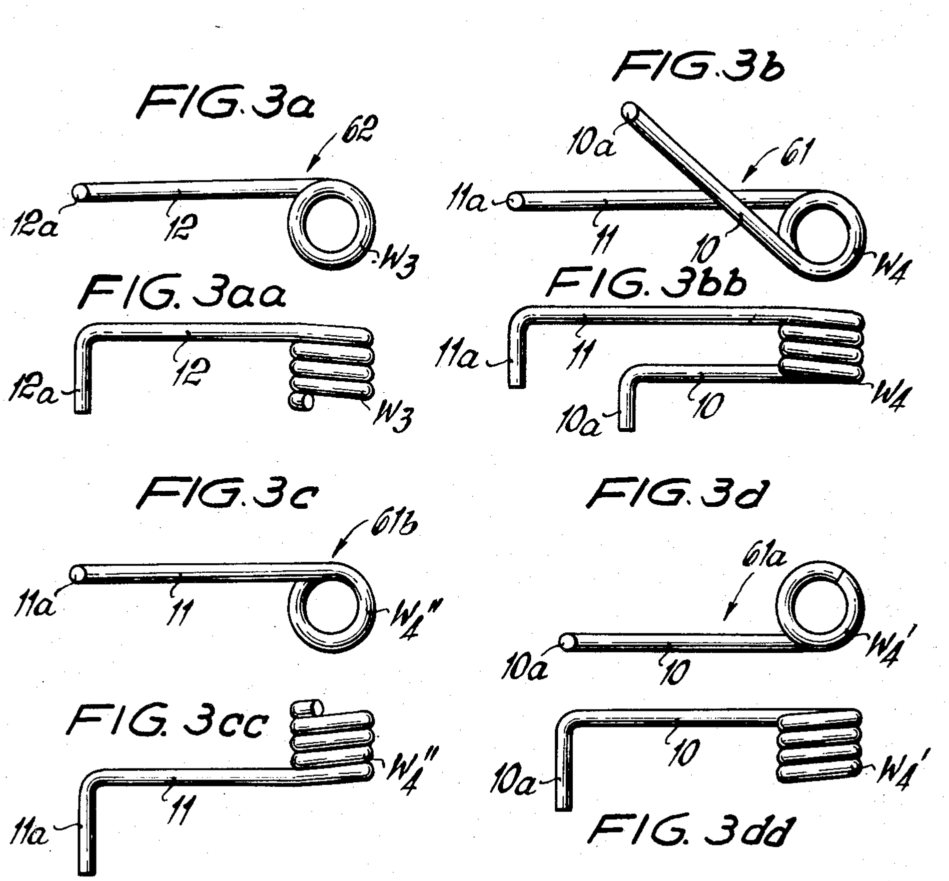

FIG. **3*a* is a bottom-plan view of one contact wire for use in the embodiment of FIG. 1**;

FIG. **3*aa*** is a side view of FIG. 3a;

FIG. **3*b* is a bottom view of a further contact wire for use in the embodiment of FIG. 1**;

FIG. **3*bb* is a side view of FIG. 3*b*;**

FIG. **3*c* is a bottom view of an additional contact wire for use in the embodiment of FIG. 1**;

FIG. **3*cc* is a side view of FIG. 3*c***;

FIG. **3*d* is a bottom view of yet an additional contact wire for use in the embodiment of FIG. 1**;

FIG. **3*dd* is a side view of FIG. 3*d*;**

Figure 2:
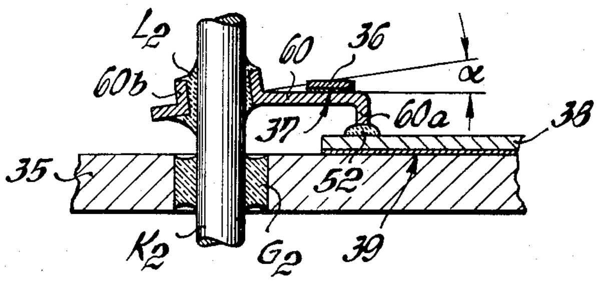
FIG. 2 is a fragmentary section taken on the line II—II of FIG. 1.
Figure 4:
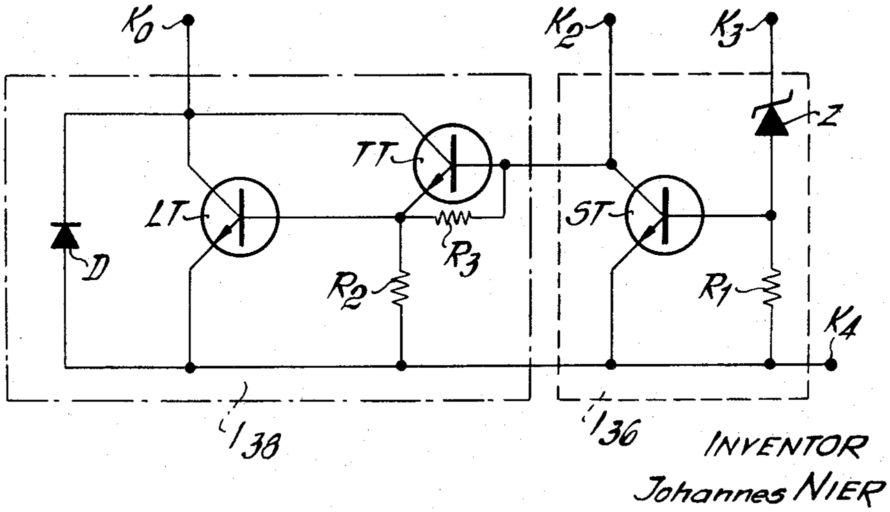
Figures 5, 6:
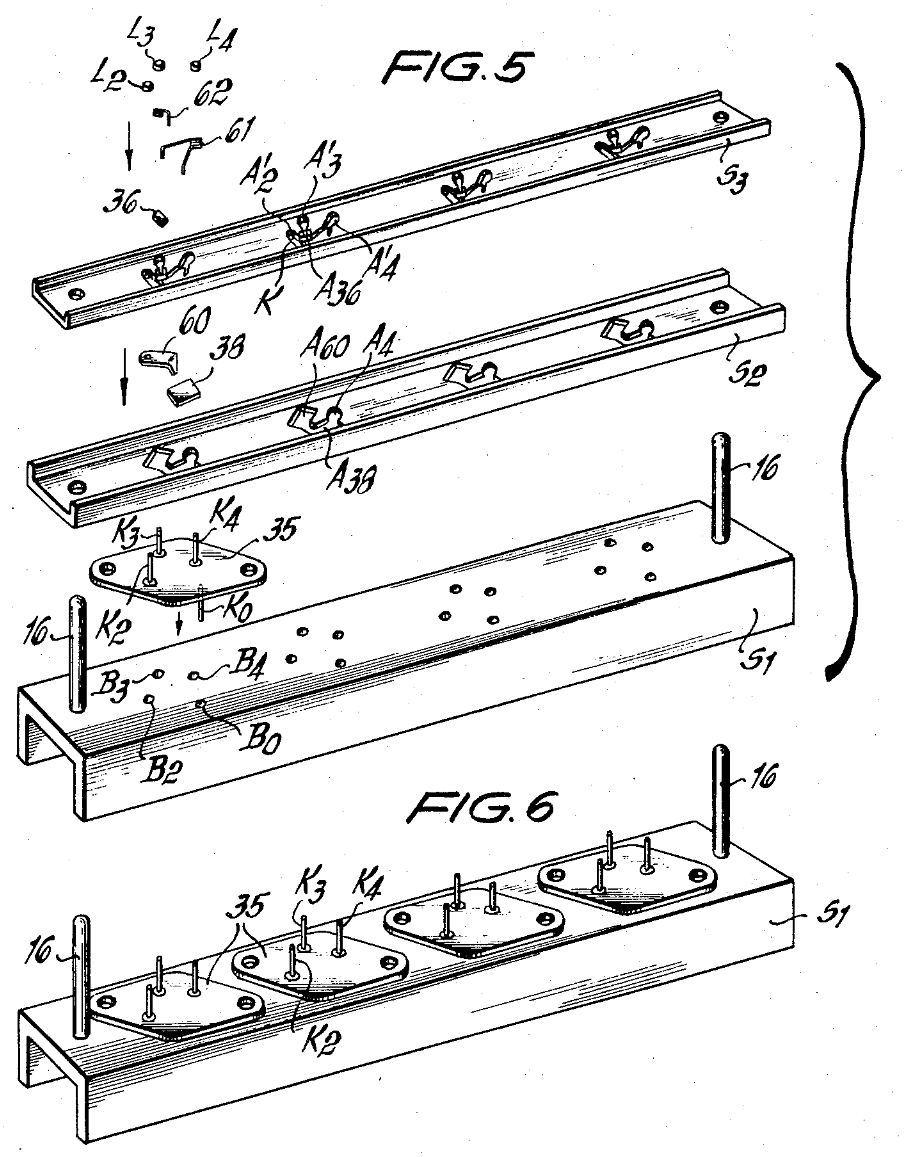
Figures 7, 8, 9:
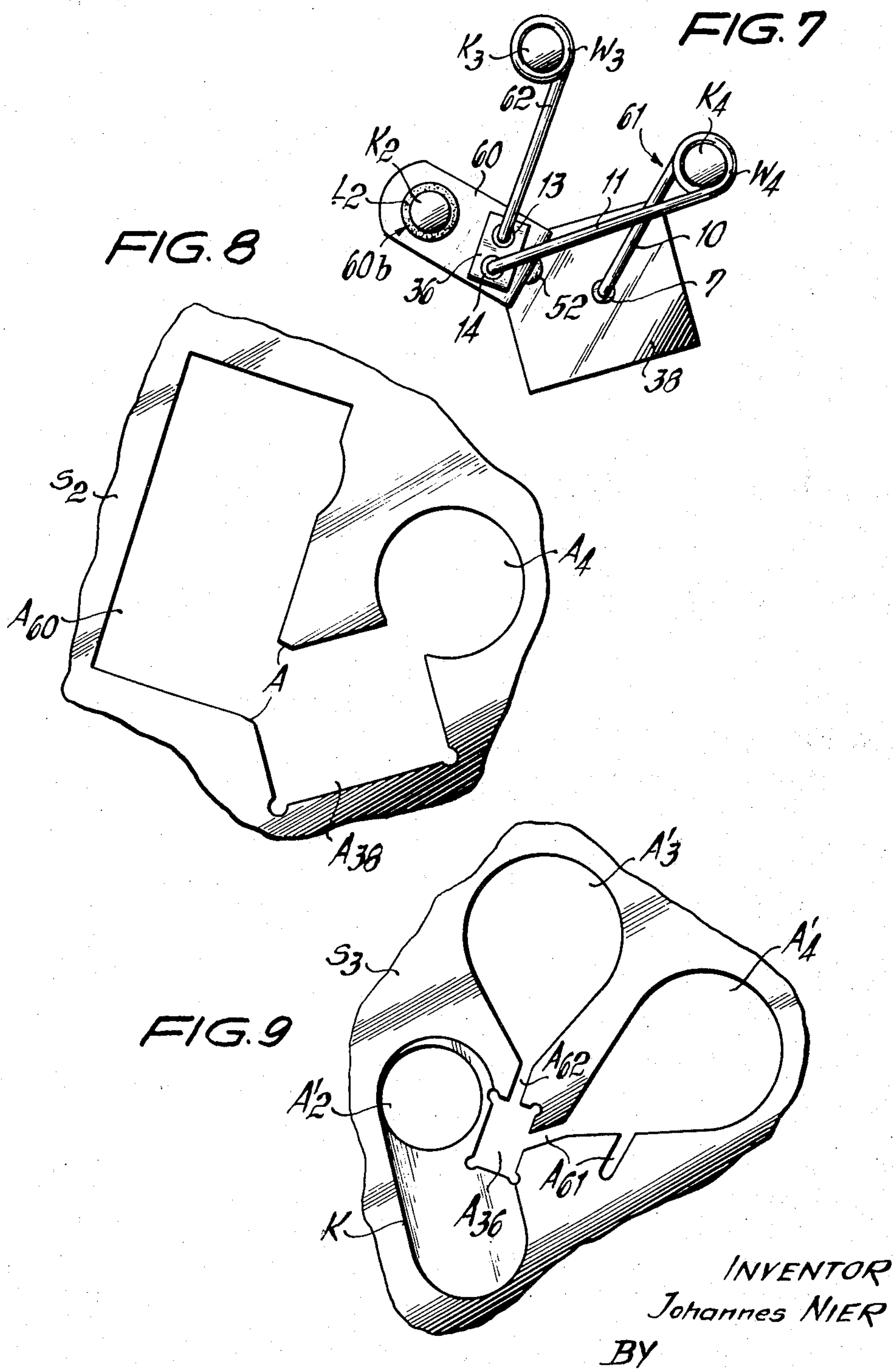

FIG. 4 is the electrical circuit diagram of a hybrid semiconductor unit according to the present invention in which both semiconductor bodies are monolithic;

FIG. 5 is a perspective exploded view illustrating the assembly templates used in assembling the device according to the present invention, with the respectively associated components of the semiconductor unit;

FIG. 6 is a perspective view of the first of the three templates with four pre-applicated socket plates carried thereby;

FIG. 7 is a plan view of the semiconductor unit of FIGS. 1 and 2 with the cover removed for clarity, with the socket plate and its first contact pin also eliminated for clarity;

FIG. 8 is a top-plan view of the cut-outs in the second assembly template; and FIG. 9 is a top-plan view of the cut-outs in the third assembly template.

DESCRIPTION OF THE PREFERRED EMBODIMENTS

Discussing now the drawing in detail it is firstly emphasized that the semiconductor unit illustrated in FIGS. 1, 2 and 7 comprises two semiconductor bodies 38 and 36 of generally the shape of small plates. Of these, the semiconductor body 38 is provided on its underside with a first contact 39 which is illustrated in FIG. 2 and covers the entire underside of the body 38. This contact is solder-connected with a socket plate 35 which constitutes a part of the housing of the unit and at the same time constitutes an electrode contact for the semiconductor body 38. At its underside the socket plate 35 carries a first contact pin $K_0$ which serves for current supply for the contact 39 of the body 38.

The underside of the semiconductor body 36 is also provided with a first contact which in turn covers the entire underside of the body 36. This contact 37 of the body 36 is soldered to a carrier 60 arranged above the socket plate 35 and which is provided with a hole in which a second contact pin $K_2$ is received.

To permit proper adjustment of the semiconductor body 36 during the assembly of the unit, it is desirable that on assembly the plane of the carrier, that is the section of the carrier 60 which supports the semiconductor body 36, be capable of adjustment in parallelism with the upper surface of the socket plate 35. For this purpose the whole of the carrier 60 is provided with a cylindrical bead 60*b* which is coaxial with the hole 60. Solder $L_2$ serves to solder connect the carrier 60 via the bead 60*b* with the second contact pin $K_2$.

In the interests of ready assembly and movability during soldering of the semiconductor unit the inner diameter of the bead 60*b* should be somewhat larger than the outer diameter of the contact pin $K_2$, and specifically be 0.05 mm larger than the outer diameter of the contact pin $K_2$ which is 1 millimeter, and this results in a loss of the guidance desired by the aid of the bead 60*b* along the contact pin $K_2$ during assembly and the parallel positioning of the carrier plane and surface of the socket plate 35; the reason for this is that the axis of the contact pin $K_2$ and the bead 60*b* move to skew position when the parallelism adjustment is carried out. To overcome this problem the portion of the carrier 60 which supports the semiconductor body 36 is bent at an angle of 7° (see FIG. 2) with reference to the cross-sectional plane of the bead 60*b* if the axial length of the bead 60*b* is 1 millimeter, given the other aforementioned dimensions for the diameter of the bead and of the pin $K_2$. The latter, incidentally, serves to supply electrical energy to the contact 37 of the semiconductor body 36. It passes through the socket plate 35 in insulated relationship by means of a glass inclusion $G_2$.

The drawing shows that in addition to its first contact 37 located at the underside, the semiconductor body 36 has a second contact 36 located at its upper side and connected with a third contact pin $K_3$ by means of the contact wire 36. This contact pin $K_3$ also passes in insulated relationship through the socket plate 35 by means of a glass inclusion $G_3$.

The contact wire 62 (see FIGS. 3*a* and 3*aa*) comprises a straight at least substantially horizontal center section 12, a first end section 12*a* which is also straight but angled with reference to the center section 12 and extending at least substantially vertical, and an additional end section $W_3$ which also extends at an angle to the center section 12 but is helically convoluted. The axis of the helically convoluted end section $W_3$ extends vertical or at near vertical. The lower end of the section 12*a* is soldered to the contact 13 of the semiconductor body 36 whereas the end section $W_3$ is pushed over the contact pin $K_3$ and soldered to the same.

The second contact 52 of the semiconductor body 38 is provided at the upper side thereof and electrically conductively connected to the carrier 60, and the drawing clearly shows that this electrically conductive connection is effected by the carrier 60 itself which for this purpose comprises a downwardly bent and downwardly tapering section 60*a* whose lower end is soldered with the contact 52, thereby avoiding the necessity for providing a separate contact wire.

A third contact 7 is provided on the semiconductor body 38 arranged adjacent the second contact 52 at the upper side of the body 38. Similarly, the semiconductor body 36 has a third contact 14 provided at its upper side. Each of the contacts 7 and 14 is electrically conductively connected with a common fourth contact pin $K_4$ which passes in insulated relationship through the socket plate 35 by means of a further glass inclusion $G_4$. The conductive connection is established by means of a common contact wire 61 (see FIGS. 3*b* and 3*bb*) which is provided with two vertically extending end sections 10*a*, 11*a* whose lower free ends are soldered with the contacts 7 and 14, respectively. There are further provided two at least substantially horizontal sections 10 and 11 and located between these a helically convoluted center section $W_4$ which is pushed over the fourth contact pin $K_4$ and soldered to the same.

It will be appreciated that the illustrations in FIGS. 3*a*–3*d* are all on a substantially enlarged scale for purposes of clarity. Keeping this in mind it is emphasized that in place of the contact wire 61 of FIGS. 3*b* and 3*bb*, it is also possible to use individual contact wires 61*a* and 61*b* as illustrated in FIGS. 3*d*, 3*dd* and 3*c*, 3*cc*. The contact wire 61*a* is intended for establishing contact with the contact 7 and is, as shown in FIGS. 3*d*, 3*dd* substantially constructed in the same manner as the contact wire 62 of FIGS. 3*a*, 3*aa*. In the contact wires 61*a*, 62 the helical convolution $W_4$ or $W_3$ — as seen from the center section 10 or 12, respectively — extends in the same direction as the opposite straight end section 10*a* or 12*a*, respectively. In the contact wire 61*b*, however, which is intended for the contact 14 and illustrated in FIG. 3*c*, 3*cc*, the convolution $W_4''$ and the end section 11*a* are so arranged as to obtain a good pretensioning force, in that the two end sections $W_4''$ and 11*a* extend in mutually opposite directions as seen with reference to the center section 11.

It will be appreciated that the two semiconductor bodies 36 and 38 may be discrete elements of which each for instance comprises only a single transistor. However, they may also be in the form of monolithic integrated circuits $I_{36}$ and $I_{38}$ which may for instance by produced according to the planar technology. FIG. 4 illustrates a possible exemplary embodiment of such a type of construction, with which type the present invention is concerned, and wherein both the semiconductor body 36 and the semiconductor 38 comprise an integrated circuit. In FIG. 4 the integrated individual elements provided in the semiconductor body 36 are shown in broken lines, and as provided in the semiconductor body 38 is shown in dot-dash lines. In this embodiment the semiconductor body 36 is provided with a monolithic integrated circuit composed of a control transistor ST a resistor $R_1$ in parallelism with the emitter-base circuit of the control transistor and a Zener diode Z whose anode is connected with the basis of the control transistor ST. The first contact 37 of the semiconductor body 36, which is solder-connected with the carrier 60, constitutes the collector contact of the control transistor ST, whereas the second contact 13 constitutes the cathode contact of the Zener diode C and the third contact 14 constitutes the emitter contact of the control transistor ST.

In the embodiment illustrated in FIG. 4 the semiconductor body 38 contains a Darlington transistor circuit. This is composed of a driver transistor TT, a power transistor LT whose collector is connected with the collector of the driver transistor and the basis of which is connected with the emitter of the driver transistor, and there is further provided a resistor $R_3$ arranged in parallelism with the emitter-basis circuit of the driver circuit, a resistor $R_2$ arranged in parallelism with the emitter-basis circuit of the power transistor, and a diode D in parallelism with the emitter-collector circuit of the power transistor; the anode of the diode D is connected with the emitter of the power transistor.

The first contact 39 of the semiconductor body 38, which is solder-connected with the solder plate 35, constitutes the joint collector connection for the two transistors TT and LT, whereas the second contact 52 constitutes the basis connection of the driver transistor TT and the third contact 7 constitutes the emitter connection of the power transistor LT. The two integrated circuits $I_{36}$ and $I_{38}$ can be used as voltage regulators in a manner analogous to the manner described in the aforementioned copending application.

Coming now to FIGS. 5, 6, 8 and 9 it will be seen that these illustrate a holding device for assembly of the novel semiconductor unit. It is composed essentially of three templates $S_1$, $S_2$ and $S_3$ provided with cut-outs for the individual components of the unit. They are stacked in superimposed relationship and guided in parallelism by means of the guide pins 16 provided in the first template $S_1$. In the illustrated embodiment the arrangement is so constructed that four semiconductor units can be assembled simultaneously and in side-by-side relationship, and can then be soldered—that is their individual components can be solder-connected—in a single passage through a soldering oven with the templates $S_2$ and $S_3$ being removed immediately before entry of the template $S_1$ and its associated semiconductor units into the soldering oven.

For the assembly purposes the socket plate 35 with its contact pins $K_0$, $K_2$, $K_3$ and $K_4$ must already be prefabricated. For this purpose the contact pins $K_2$, $K_3$ and $K_4$ are inserted into bores of the socket plate 35 and are retained therein by fused-glass insulating material, whereby the glass inclusions $G_2$, $G_3$ and $G_4$ result so that the pins $K_2$, $K_3$ and $K_4$ are insulated from the socket plate 35. Thereupon the pin $K_4$ is butt-welded on the underside of the socket plate 35. It is emphasized, however, that in lieu of this arrangement the pin $K_4$ can also be hard-welded to the underside of the socket plate 35 at the same time as the glass inclusions are provided. Once this is carried out, all metal surfaces of the prefabricated socket 35 are coated with a metallic layer wettable with soft solder, preferably a layer of nickel. FIG. 5 shows that when semiconductor units are to be assembled by means of the templates $S_1$, $S_2$ and $S_3$, four of the prefabricated socket plates 35 are inserted with their respective contact pins $K_0$, $K_2$, $K_3$ and $K_4$ into bores $B_0$, $B_2$, $B_3$ and $B_4$ provided for this purpose in the first template $S_1$. This is also evident from FIG. 6 and it is pointed out that thereupon the second template $S_2$ is so applied that it overlies the upper sides of the socket plates 35. The contact pins $K_2$, $K_3$ and $K_4$ projecting at these upper sides pass through correspondingly configurated cut-outs A60, A4 provided in the second template $S_2$, as shown in FIG. 8. The cut-out $A_{60}$ serves at the same time for receiving the carrier 60. A further cut-out $A_{38}$ is provided in the second template $S_2$, as shown in FIGS. 5 and 8; into this there is inserted with the aid of a suitable tool, for instance a suction tool, a semiconductor body 38 which is to be soldered onto the socket plate 35. The semiconductor body 38 is covered or coated with solder at least at its upper contacts 52 and 7. The edges of the cut-out $A_{38}$ are widened for protecting the corners of the semiconductor body. It is possible if desired to cover or coat the underside of the semiconductor body 38 also with solder, but in place of this or in addition thereto it is also possible to insert a plate of solder into the cut-out $A_{38}$ before the semiconductor body 38 is introduced.

Once this has taken place the carrier 60 is introduced into the cut-out $A_{60}$ of template $S_2$ and its position is determined in predetermined orientation by means of the bead 60*b* which is pushed during the insertion over the contact pin $K_2$, as well as by the two contact portions A in the cut-out $A_{60}$ as evident from FIG. 8. As this takes place, the downwardly directed section 60*a* of the carrier 60 contacts the precoated contact 52 of the semiconductor body 38. Now the third template $S_3$ is put in place as shown in FIG. 5. As illustrated in FIG. 9 the third template $S_3$ has cut-outs $A'_2$, $A'_3$ and $A'_4$ for passage of the contact pins $K_2$, $K_3$ and $K_4$. A suitable tool, such as a suction tool, is again used for inserting the semiconductor body 36 into a further cut-out $A_{36}$ of the third template $S_3$, as shown in FIGS. 5 and 9. The template $S_3$ is depressed along the contour K for facilitating this insertion and to such an extent that the bottom of this depression is approximately on a level with the surface of the semiconductor body 36. As before, the corners of the cut-out $A_{36}$ are widened for protection of the edges of the semiconductor crystal.

At its upper contacts 13 and 14 the semiconductor body 36 is already coated with solder. It can also be coated at its underside with solder but in place of this, or in addition thereto, the carrier 60 may be provided at the portion at which the semiconductor body 36 is to be secured thereto, with a solder precoating. Thereupon, the contact wires 61 and 62 are inserted into cut-outs $A_{61}$, $A_{62}$ provided for this purpose in the template $S_3$ and located above the recesses or cut-outs $A_{38}$ and $A_{60}$ of the second template $S_2$. During such insertion the helically convoluted sections $W_4$ and $W_3$ of the contact wires 61 and 62 are pushed over the respectively associated contact pins $K_4$ and $K_3$. Because of the template guidance the end points of all current supply contacts automatically become associated with the associated contacts of the semiconductor bodies 36 and 38.

When the assembly has progressed to this point, the helically convoluted sections $W_3$ and $W_4$ are downwardly depressed along their respectively associated contact pins $K_3$ and $K_4$— simultaneously and with the aid of a gauge—until they extend skew to these pins and become clamped. This displacement is only by a small distance and by proper dimensioning of the lengths as well as of the straight end sections 10*a*, 11*a* and 12*a* as well as of the helices $W_3$ and $W_4$, the use of a template may be omitted if the helices $W_3$ and $W_4$ are displaced downwardly along their associated contact pins $W_3$ and $W_4$ until they abut against the respectively associated glass inclusions $G_3$ and $G_4$; this results automatically in an always reproducible pretensioning force.

At this point annuli $L_2$, $L_3$ and $L_4$ are slipped over the contact pins $K_2$, $K_3$ and $K_4$, respectively. The templates $S_2$ and $S_3$ are now lifted off and thereupon the template $S_4$ carrying the four assembled semiconductor units, is introduced into the soldering oven. Conventionally, such soldering ovens are of the pass-through type, and when the now solder-connected and assembled units with the template $S_1$ re-emerge from the soldering oven, the units are ejected from the template $S_1$ by means of a non-illustrated ejector of known construction.

It is pointed out that the shifting of sections $W_3$ and $W_4$ overcomes the height differential between the contacts 7 and 14 which otherwise could make simultaneous abutment of the lower ends of the common connecting wire 61 impossible. On the other hand, this displacement or shifting assures that the now pretensioned contact wires 61 and 62 assure that the entire unit composed of the components 61, 62, 36, 60 and 38 will properly descend during the soldering process so that these portions will always remain in proper contact with one another at the contact points where they are to be solder-connected.

It will be appreciated that is is necessary for the contact wires 61 and 62 to consist of a material which not only has good electrical conductivity, but which is also readily solderable and which must have necessary spring characteristics in the interest of obtaining the desired pretension. Furthermore, these features must be retained during heating to soldering temperature, that is the recrystallizing temperature of the cold-deformed material of which the wires 61 and 62 consist, must be above the soldering temperature so that the elasticity modulus of the wires remains unchanged during the soldering process. In accordance with the invention it has been found that silver-copper alloys with low percentages by weight of copper, for instance Ag 97 Cu 3, as well as cold-deformed nickel wire are excellent for this purpose. Furthermore, and also in accordance with the invention, all solder material provided at the contacts of the semiconductor bodies 36 and 38 consist of a soft solder on lead basis, preferably of Pb 96 Sn 4. The solder annuli $L_2$, $L_3$ and $L_4$ may consist of Pb 92.5 Sn 5, Ag, of Sn 96 Ag 4 Bi 0.5 or of an alloy of Pb-Sn whose tin content is between 6 and 10 percent by weight. Soldering of the hybrid semiconductor unit is carried out advantageously, but not necessarily, in a pass-through soldering oven filled with $N_2$ 90 $H_2$ 10 at a temperature of the hybrid of approximately 375°C.

In FIGS. 3*d*, 3*dd* and 3*c*, 3*cc* individual contact wires 61*a*, 61*b* have been shown which may be used, as desired, in place of the single common contact wire 61 for connecting the contacts 7 and 14 with the contact pin $K_4$. In this case the insertion of these individual contact wires 61*a*, 61*b* into the cut-out $A_{61}$ of the third template $S_3$ is carried out in that first the contact wire 61*a* is inserted and its downwardly directed helix section $W'_4$ is pushed over the pin $K_4$. Thereupon a solder annulus is pushed over the pin $K_4$ and the second contact wire 61*b* is inserted into the cut-out and pushed with its upwardly directed helical section $W''_4$ over the contact pin $K_4$. After the two contact wires 61*a*, 61*b* are moved to effect the desired pretensioning, a second solder annulus $L_4$ is placed over the contact pin $K_4$ before the template $S_1$ with its assembled but not yet solder-connected semiconductor units is ultimately introduced into soldering oven.

It will be appreciated that with the construction according to the present invention the assembly of semiconductor units according to the present invention is still simpler than that set forth in the aforementioned copending application, that it is less time-consuming and that material can be saved with a concomitant reduction in the manufacturing expense. It must be kept in mind that units of the type here in question are mass-produced in exceedingly large quantities so that savings of even fractions of a cent per unit are desirable.

It will be understood that each of the elements described above, or two or more together, may also find a useful application in other types of constructions differing from the types described above.

While the invention has been illustrated and described as embodied in a semiconductor unit, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, if such adaptations should and are intended to be comprehended within the meaning and range of equivalence of the following claims.

What is claimed as new and desired to be protected by Letters Patent is set forth in the appended claims:

1. A semiconductor unit, comprising a first semiconductor body having a first and a second surface on its opposite sides; a first contact provided on and covering said first surface; a heat-producing circuit provided in said first semiconductor body; a thermally and electrically conductive socket plate soldered to said first contact provided on said first surface in thermally and electrically conductive relationship and having a first contact pin; a second semiconductor body having a monolithic integrated circuit formed therein and having a first and a second major surface; a second contact provided on and covering said first surface of said second semiconductor body; a carrier connected with said socket plate and electrically insulated therefrom, said carrier also being connected with said second semiconductor body and being located between the same and said socket plate; a contact portion on said second semiconductor body on said second surface thereof facing away from said carrier, and another contact pin penetrating said socket plate in insulated relationship; a connecting wire having a straight first end portion conductively soldered to said contact portion, a helically convoluted second end portion conductively soldered to said other contact pin, and a center portion with respect to which each of said end portions extends at an angle; and an additional contact portion provided on said first semiconductor body on said second surface thereof facing away from said socket plate, said additional contact portion being in direct electrically conductive relationship with said carrier.

2. A semiconductor unit as defined in claim 1, said one semiconductor body being said second semiconductor body; and wherein said integrated circuit comprises a control transistor, a resistor in parallel with the emitter-base line of said control transistor, and a Zener diode having an anode connected with the base of said control transistor, said second contact of said second semiconductor body constituting the collector contact of said control transistor, another contact of said second body constituting the cathode contact of said Zener diode and a further contact of said second body constituting the emitter contact of the control transistor.

3. A semiconductor unit as defined in claim 1, wherein said one semiconductor body is said second semiconductor body, and wherein said first semiconductor body comprises a Darlington transistor circuit.

4. A semiconductor unit as defined in claim 3, said Darlington transistor circuit comprising a driven transistor, a power transistor having a collector connected with the collector of said driven transistor and a base connected with the emitter of said driven transistor, a resistor in parallel with the emitter-base line of said driven transistor, an additional resistor in parallel with the emitter-base line of said power resistor, and a diode in parallel with the emitter-collector line of said power transistor and having an anode which is connected with the emitter of said power transistor, said first contact of said first body constituting the collector contact for both of said transistors, an additional contact of said first body constituting the base contact of said driven transistor, and a further contact of said first body constituting the emitter contact of said power transistor.

5. A semiconductor unit as defined in claim 1, wherein said connecting wire is composed of a silver-copper alloy having a small percentage by weight of copper.

6. A semiconductor unit as defined in claim 5, wherein the composition of said alloy is Ag 97 and Cu3.

7. A semiconductor unit as defined in claim 1, wherein said connecting wire is composed of cold-formed pure nickel.

* * * * *